United States Patent [19]

Burke et al.

[11] Patent Number: 4,681,440
[45] Date of Patent: Jul. 21, 1987

[54] HIGH-SENSITIVITY CID PHOTOMETER/RADIOMETER

[75] Inventors: Hubert K. Burke, Scotia; Gerald J. Michon, Waterford, both of N.Y.

[73] Assignee: General Electric Company, Schenectady, N.Y.

[21] Appl. No.: 799,068

[22] Filed: Nov. 18, 1985

[51] Int. Cl.$^4$ .......................... G01J 1/44; H01L 27/14
[52] U.S. Cl. ................. 356/218; 250/211 R; 357/24; 357/30
[58] Field of Search ............... 356/218; 250/211 R, 250/211 J; 357/30, 24 LR

[56] References Cited

U.S. PATENT DOCUMENTS 3,786,263  1/1974  Michon .......................... 357/30
3,983,395  9/1976  Kim ............................ 357/24 LR Primary Examiner—R. A. Rosenberger
Attorney, Agent, or Firm—Geoffrey H. Krauss; James C. Davis, Jr.; Marvin Snyder

[57] ABSTRACT

A high-sensitivity photometer/radiometer uses a single-pixel charge-injection-device (CID) light-sensitive sensor, and associated circuitry for: non-destructively reading-out the sensor charge level; for summing signals proportional to the charge level signal; and for then displaying the level. With cooling of the CID sensor, the sensitivity of the photometer can be sufficient to read incident flux levels on the order of several photons per second.

26 Claims, 10 Drawing Figures

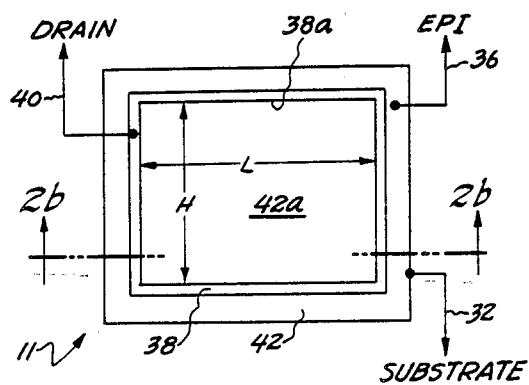
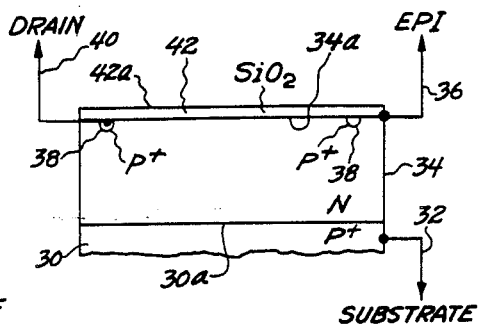
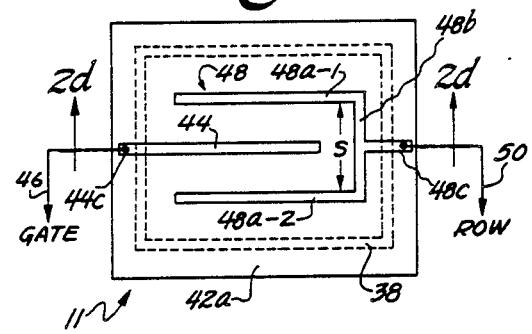
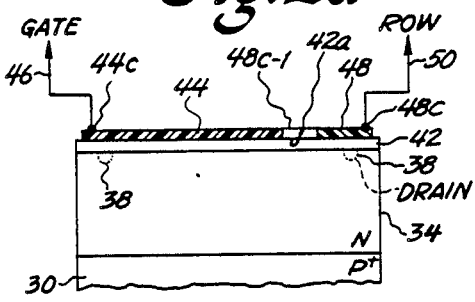
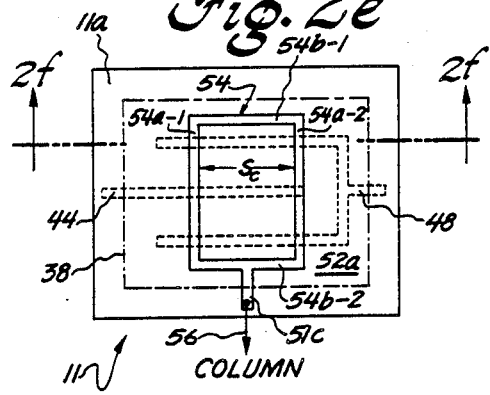
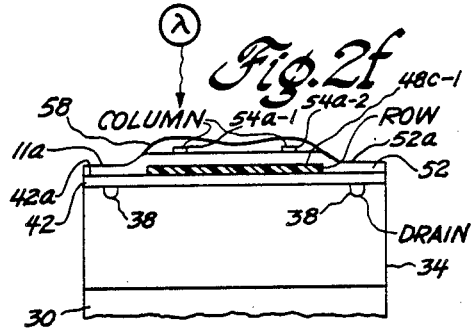

HIGH-SENSITIVITY CID PHOTOMETER/RADIOMETER

BACKGROUND OF THE INVENTION

The present invention relates to optical radiation measurement apparatus commonly known as a photometer or radiometer and, more particularly, to a novel high-sensitivity photometer/radiometer utilizing a single-pixel chargeinjection-device (CID) and associated circuitry, for sensing optical radiation magnitudes less than 10E-14 watts/cm$^2$.

It is well known to provide optical radiation measurement apparatus utilizing a solid-state sensor, such as a silicon diode detector and the like, or a vacuum tube sensor, such as photomultiplier and the like. It is known that a silicon diode detector can measure irradiance levels as low as about 10E-9 watts/cm$^2$, and that photomultiplier systems can measure irradiance levels as low as about 10E-12 watts/cm$^2$. A photometer using prior sensors and having a sensitivity of this order is not only expensive and complex, but will still also have a minimum sensed irradiance level which is equivalent to about 3E+7 photons per second per square centimeter. This minimum level is about 7 orders of magnitude greater than the desired ultimate sensitivity of a photometric device, i.e. a sensitivity approaching 1 photon per second per square centimeter is highly desirable. Thus, in the photonics field, wherein precise measurement of optical radiation is of great importance, even a one orderof-magnitude increase of sensitivity over the common photomultiplier sensitivity level of 10E-12 watts/cm$^2$ is not only significant, but highly desirable.

BRIEF DESCRIPTION OF THE INVENTION

In accordance with the present invention, a high-sensitivity charge-injection-device (CID) photometer/radiometer apparatus uses: a single-pixel CID optical radiation sensor which has three surface-coupled conductorinsulator-semiconductor (CIS) capacitors and a gate region in electrical series connection, and wherein each capacitor comprises at least one narrow, elongated electrode; and associated circuitry for non-destructively reading out the charge stored in the sensor at a selected sampling rate, for summing the sensor output signal samples over a predetermined time interval, and for converting the summed signal to a display of the magnitude of the radiant energy intercepted by the sensor. Relatively modest cooling of the sensor (as by a Peltier cooler; liquid nitrogen (LN$_2$) or the like) is desirable.

In a presently preferred embodiment of our high-sensitivity photometer/radiometer apparatus, the CID optical radiation sensor utilizes one of the three MOS capacitors as a drain, both for removing charge after termination of each readout cycle, and also as a means for introducing a bias charge prior to the beginning of the next-subsequent sensing cycle; this bias charge introduction alleviates some of the sensitivity limitations caused by dark-current shot noise, interface states, and the like, when operating the sensing CID device at reduced temperatures. The remaining pair of MOS capacitors utilize electrodes having a plurality of interconnected extended finger portions.

Accordingly, it is an object of the present invention to provide novel high-sensitivity charge-injection device photometer-radiometer apparatus.

This and other objects of the present invention will become apparent upon reading the following detailed description of a presently-preferred embodiment of the invention, when considered in conjunction with the drawings.

BRIEF DESCRIPTION OF THE DRAWINGS

FIGS. 2a-2f are three pair of plan/sectional views of the sensor, during various steps in the manufacture thereof, and are useful in appreciating construction of the sensor;

DETAILED DESCRIPTION OF THE INVENTION

Figure 1:
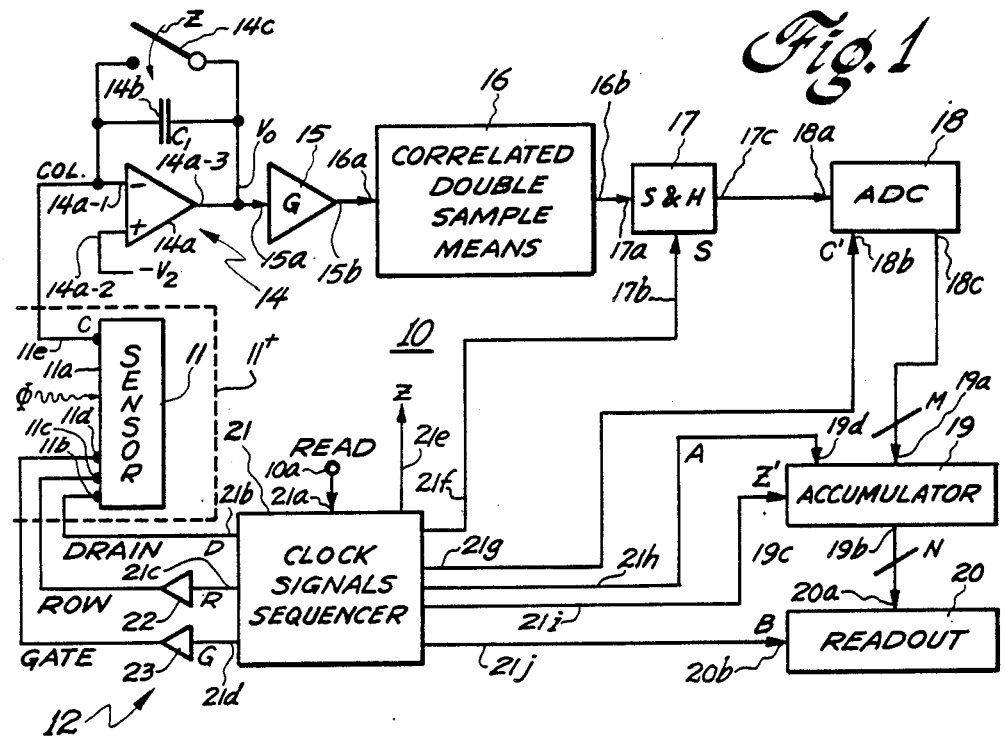
FIG. 1 is a schematic block diagram of one presently preferred embodiment of the photometer/radiometer apparatus of the present invention.

Referring initially to FIG. 1, a presently preferred embodiment of our high-sensitivity photometer/radiometer apparatus 10 utilizes a single-pixel light-sensitive charge injection device (CID) sensor 11, and associated electronic circuitry 12 for reading out from the sensor a signal proportional to the number of photons (Φ) impingent upon a sensing surface 11a of the sensor 11. Sensor 11 may be in contact with, or enclosed by, a cooling means 11+, such as a Peltier cooler, a dewar of liquid nitrogen and the like, for lowering the physical temperature of the sensor, to reduce dark current and the like deleterious signals in manner known to the art.

Sensor 11 receives a drain D signal at a first input 11b, receives a row R signal at another input 11c, and receives a gate G signal at a third input 11d. A column C signal is provided at an output 11e of the sensor. The charge caused to flow in the C output is converted to a voltage by a charge amplifier means 14, having an operational amplifier 14a receiving the column C output signal at a first, inverting input 14a-1 and receiving a reference voltage (e.g. voltage $-V_2$) at a second, non-inverting input 14a-2. An integrating capacitor 14b, of magnitude $C_1$, is connected between first input 14a-1 and the operational amplifier output 14a-3. A resetting switch means 14c is connected across capacitor 14b. The amplifier 14 output signal voltage $V_0$ is applied to the input 15a of a gain amplifier means 15, which provides its output 15b signal to the input 16a of a correlated-double-sample means 16. Means 16 operates, in manner known to the art, upon each pair of consecutive signals provided to input 16a to provide a correlated signal, at means output 16b, in which: certain otherwise-deleterious noise phenomena are eliminated; apparatus dynamic range is increased; and like benefits are realized. The signal at output 16b is provided to the input 17a of a sample and hold (S&H) means 17, which also receive a sample S signal at a sampling input 17b. Responsive to the sample S signal being in a predetermined state, means output 17c has an analog signal provided thereat with the amplitude of the signal at input 17a at the termination of the sample S signal at sampling input 17b. This "held" analog signal sample is provided to the analog input 18a of an analog-to-digital converter (ADC) means 18. Responsive to a conversion C' signal at a conversion control input 18b of the ADC means, the level of the analog signal then at analog input 18a is digitized, to appear as a parallel digital data word of M data bits at a digital output 18c. Typically, M=14 parallel data bits may be utilized and ADC 18 may be a standard 16-bit unit (with the output having an overrange bit and a generally-unused polarity bit). Each M-bit-wide digital data word is provided to the digital data input 19a of an accumulator means 19. The digital data word provided at an output 19b of the accumulator is the sum of the input digital data words provided after a zeroing signal Z has appeared at a first control input 19c; each updating of the accumulator output 19b is carried out (after the associated preceding zero Z signal) responsive to an accumulate A signal provided at a second control input 19d. The accumulated digital data output 19b provides a data word of N bits (with N typically being greater than 20 bits) to the data input 20a of a data readout means 20. The data presently being provided to input 20a is provided in human-viewable form on the readout 20, except when a display blanking B signal is provided at a readout control input 20b.

A clock signals sequencer means 21 utilizes standard sequential logic and the like, to provide all of the required drain D, row R, gate G, reset/zero Z, sample S, conversion C', accumulator zero Z' and add A, and display blanking B signals in accordance with some predetermined set of amplitude and timing characteristics. Means 21 has an input 21a for receiving a READ signal from an apparatus input 10a, and thence providing a multiplicity of sequential timing signals, including: the drain D signal at a first sequencer output 21b; the row R signal at a second sequencer output 21c (which row R signal may be buffered by an additional buffer amplifier means 22); the gate G signal at a third output 21d (which gate G signal may be buffered by another buffer means 23); the charge amplifier integration capacitance reset/zero Z signal at a fourth output 21e, to temporarily close switch means 14c at a required time and for a desired time interval; the sample S signal at a fifth output 21f; the conversion C' signal at a sixth output 21g; the accumulate A signal at a seventh output 21h; the accumulator zeroing Z' signal at an eighth output 21i; and the readout blanking B signal at a sequencer ninth output 21g. The general timing and amplitude characteristics of these signals will become more apparent in the operational description of the system, hereinunder.

Referring now to all of FIGS. 2 and 2a-2f, the high-sensitivity CID photon sensor 11 is fabricated upon a substrate 30 (FIG. 2b) of a first-conductivity type of semiconductive material, such as P+ type silicon and the like. A lead 32 is provided for electrical connection to substrate 30. Upon a first major substrate surface 30a, to be positioned toward the source of photons Φ, an epitaxial layer 34 is fabricated of a second conductivity type of the semiconductor material, such as N type silicon. Lead means 36 is provided for electrical connection to the epitaxial EPI layer; the layer-substrate junction, at or adjacent to surface 30a, will be reverse-biased when the sensor is in operation. The surface 34a of the epitaxial layer, furthest from the substrate layer surface 30a, is levelled and a rectangular drain pattern of the first conductivity-type of the semiconductor material, e.g. P+ silicon, is provided as a drain formation 38 therein. The drain formation inner periphery 38a (best seen in FIG. 2a) substantially defines the photon-collecting area of the one-pixel CID sensor 11; suitable pixel length L and pixel height H dimensions may be chosen to provide a predetermined total sensor active area related to the drain inner periphery area LxH. Drain lead means 40 is provided for electrical connection to the drain electrode formation. It should be understood that drain formation 38 need not be a continuous channel, implant or other region in the epitaxial layer, but may be temporarily broken at various locations as necessary for placement of the other electrodes (to be described hereinbelow), but with the various pieces of the drain region being later electrically connected together, as by metallization and the like known means, to provide a peripheral region essentially-continuously maintained at the drain potential, for defining the active photon-collection area of the sensor. Similarly, it should be understood that, while a rectangular sensor active region is illustrated, the active sensing region can be square, circular, triangular or of any general shape, in accordance with the particular requirements of the photometer/radiometer apparatus 10 in which the sensor 11 is to be used. Thus drain region 38 may have a substantially square aspect, as shown in broken line below the surface of insulative layer 42 in FIG. 2. After fabrication of drain portions 38 and attachment of lead means 40 thereto, a thin layer 42 of an insulative material, such as silicon dioxide $SiO_2$ or the like, is formed upon the outer surface 40a of the semiconductor. The insulative layer 42 itself has an outer surface 42a upon which additional portions of the sensor 11 will be fabricated.

Figure 2:
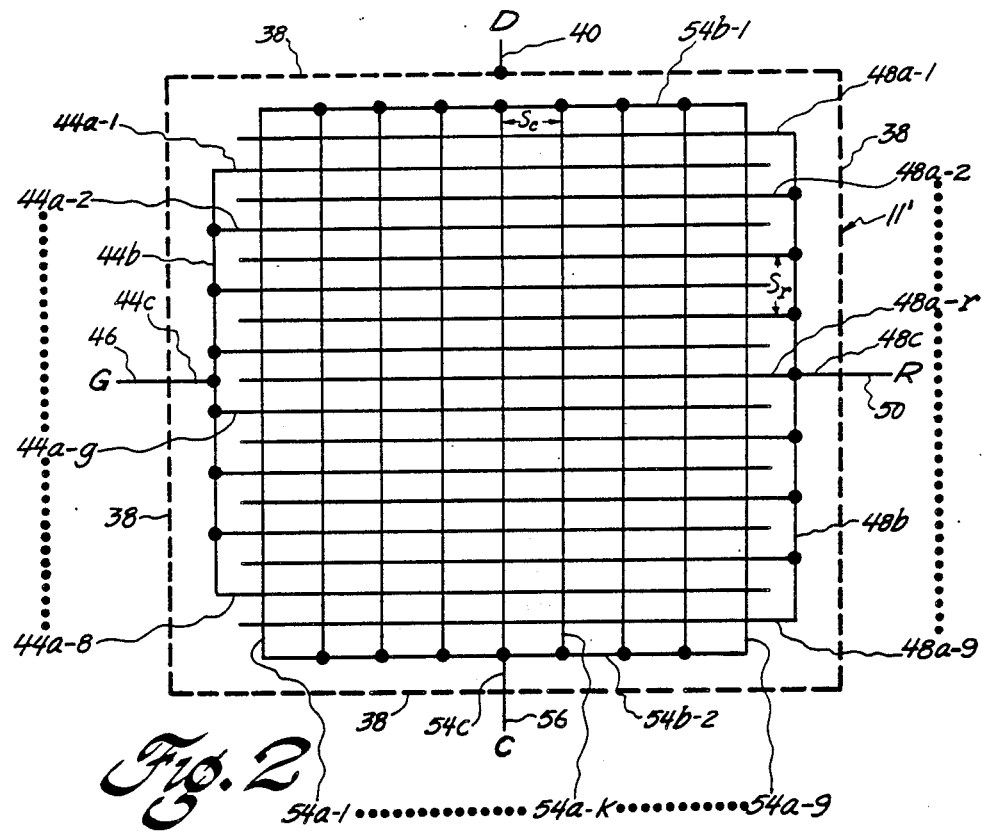
FIG. 2 is a schematic plan view of the lightadmitting surface of one embodiment of the sensor, and useful in appreciating several characteristics of the sensor.

At least one gate electrode 44 (FIGS. 2, 2c and 2d) is fabricated (typically of polysilicon) upon the insulative layer surface 42a. Gate electrode 44 may be a single elongated element, as shown in FIG. 2c, or may have a plurality of substantially parallel "finger" portions 44a-1, 44a-2, ..., 44a-g, ..., 44a-8 as shown in FIG. 2. If more than one elongated gate finger portion 44a is utilized, a common electrode end portion 44b connects one end of each of the narrow fingers to a similarly situated end of all other gate fingers, and thence to a gate electrode common connection portion 44c. A gate lead means 46 is connected to gate electrode portion 44c for coupling of gate signals to and from the date electrode.

A row electrode 48 is provided in substantially the same plane as the gate electrode, and is, in manner similar to the gate electrode, situated upon the surface 42a of the thin insulative layer. The row electrode (also typically of polysilicon) is fabricated with a plurality of narrow elongated finger portions 48a which are substantially parallel: to one another; to the gate electrode finger portion(s); and to associated sides of the drain electrode 38. Row electrode 48 has one more finger portion than the number of finger portions in the illustrated gate electrode; thus, in the single gate electrode embodiment of FIG. 2c, the row electrode has a pair of thin, elongated and substantially parallel finger portions 48a-1 and 48a-2. In the embodiment of FIG. 2, wherein the gate electrode has eight finger portions, the associated row electrode finger portions 48a-1, 48a-2, ..., 48a-r, ... 48a-9 are all substantially parallel to the gate electrode fingers portions of sensor 11'. Each of the plurality of row electrode finger portions 48a are connected at an associated end thereof, opposite to the associate connected ends of the gate electrodes, by a common row electrode portion 48b. A row electrode connection portion 48c extends from end portion 48b, in a direction opposite to the direction in which the gate electrode connection portion 44c extends from end portion 44b. A row electrode lead means 50 is connected to row electrode extension portion 48c. The number of row electrode finger portions (and, therefore, the number of gate electrode finger portions) is established by the row electrode spacing distance $S_r$ (see FIGS. 2 and 2c) which is selected to be as large as possible, but consistent with the diffusion length of charge carriers, e.g. holes, in the semiconductor material being utilized. By maximizing the spacing $S_r$ between the elongated narrow electrodes, consistent with minority carrier diffusion length, a minimum amount of the pixel area is occluded by the electrodes, thereby maximizing apparatus photon sensitivity.

A second insulative layer 52 is now provided upon all of the upper surface of the gate and row polysilicon electrodes and at least adjacent portions of the remaining first insulative layer upper surface 42a. Thereafter, a second formation of polysilicon is deposited (FIGS. 2e and 2f) to form a column electrode 54 upon the second insulative layer surface 52a. Column electrode 54 comprises a plurality of narrow and elongated finger portions 54a extending substantially perpendicular to the elongated extension directions of the gate electrode finger portions 44a and the row electrode finger portions 48a. A first column electrode connection portion 54b-1 connects all aligned first ends of the column electrode finger portions 54a and a second column electrode connection portion 54b-2 connects all aligned second ends of the same finger portions. Interconnection of all first ends and interconnection of all second ends of the column electrode finger portions is highly desirable to minimize the distance that carriers must travel during collection in the readout process. The spacing between each adjacent pair of the plurality of column electrode finger portions 54a is a spacing distance $S_c$ again established by the charge carrier, e.g. hole, diffusion length at the sensor operating temperature. It will be seen that the column electrode, as a minimum, will include a pair of finger portions 54a-1 and 54a-2, as in the sensor of FIG. 2e, and can include a much larger number, illustratively 9, of column electrodes 54a-1, ..., 54a-k, ..., 54a-9, with the far ends thereof connected by a first connection portion 54b-1 and the near ends connected by a different connection portion 54b-2. A column electrode connection 54c extends from portion 54b-2. Lead means 56 is electrically connected to the column electrode connection portion 54a. A thin insulative protective layer 58 is fabricated at least over the column electrode 54 portions and adjacent areas of second insulative layer upper surface 52a.

Figure 3:
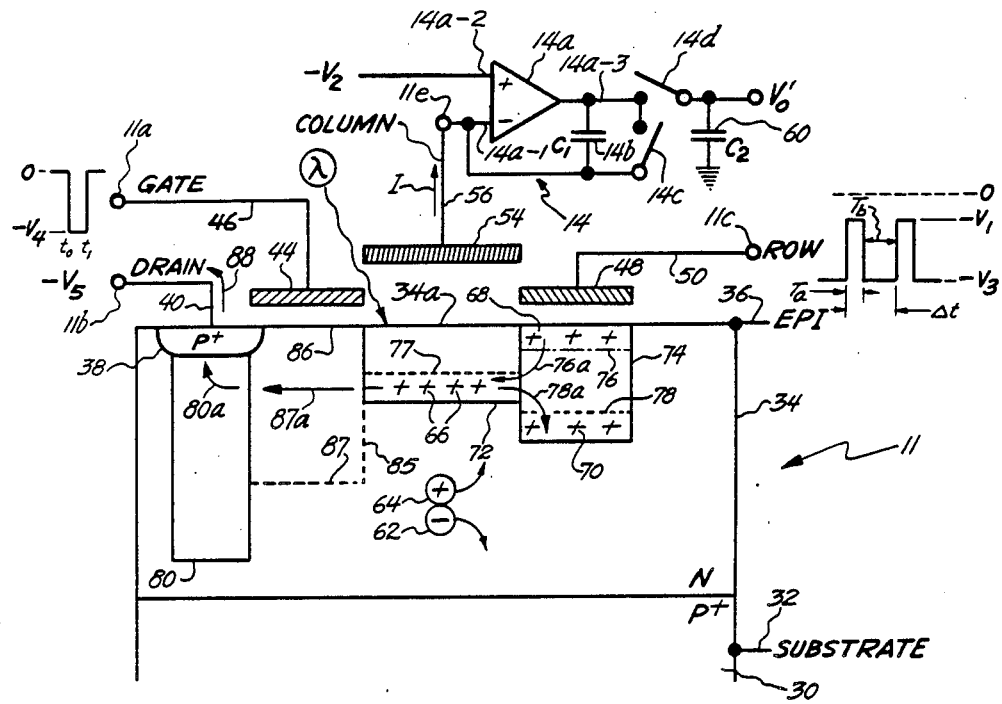
FIG. 3 is a schematic sectional view through the sensor, conjunction with the associated circuitry for forming an output signal therefrom, and useful in appreciating sensor operation.
Figure 3A:
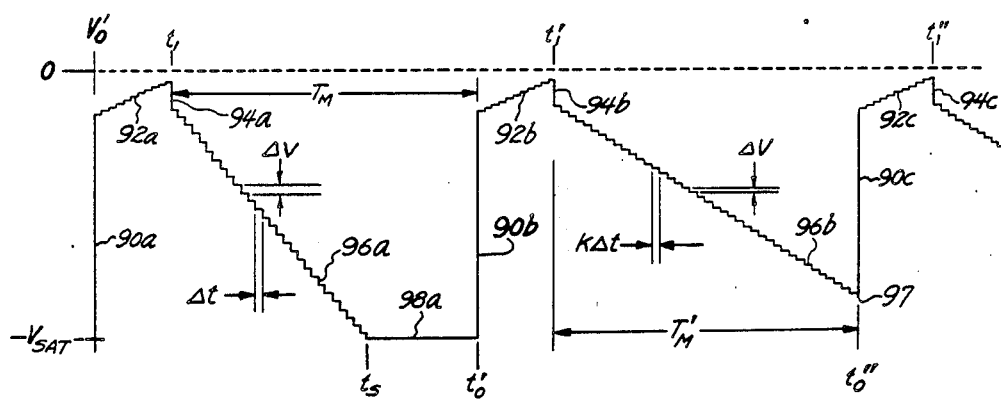
FIG. 3a is a graphic illustration of the sensorand-charge amplifier output signal waveform, also useful in appreciating certain operational characteristics of the apparatus.

Referring now to FIGS. 3 and 3a, in operation, sensor 11 and the associated charge amplifier means 14 (which can be analyzed as if an output switch 14d allows the charge in an equivalent output element 60, of capacitance $C_2$, to charge and thus charge the voltage $V_0'$ thereacross) operates as follows: Sensor 11 is so positioned that incident photons $\Phi$ will travel through the insulative layers and the semitransparent polysilicon column, row and gate electrodes and enter the epitaxial layer 34 within the drain region, to form a pair of electrons 62 and holes 64 (i.e. oppositely-charged charge carriers). One of the types of carriers, here holes 64, are be collected and subsequently readout for contribution to the sensor output signal voltage $V_0$. These charge carriers (as carriers 66, 68 or 70) are stored in, or transferred into or out of, one or more of a plurality of potential wells formed beneath the sensor electrodes. A first potential well 72 is formed beneath the column electrode 54, while another potential well 74 is formed beneath row electrode 48. While both wells 72 and 74 are continuously present, the relationship of the "depth" of each of these wells changes. Well 74 may be formed to a first, rather shallow depth 76 (indicated in chain line), as by application of a first potential (e.g. $-V_1$), which depth is less than the depth of potential well 72, corresponding to the magnitude of another voltage (e.g., $-V_2$) applied to column electrode 54. A voltage $-V_1$ of about $-3.5$ volts and a voltage $-V_2$ of about $-8$ volts may be utilized in a sensor having the illustrated polarity-type semiconductor substrate and epitaxial layers, with the epitaxial layer connection 36 being held at about zero volts, and with the substrate lead 32 being held at a voltage (e.g. about $-5$ volts) to maintain a reverse bias across the substrate-epitaxial layer junction. During the time interval, e.g. time interval $T_a$, when the first voltage ($-V_1$) is present on row electrode 48, the column potential well 72 has a greater depth than the depth of row potential well 76, whereby the positive charge 68 flows as shown by arrow 76a, into column potential well 72, raising the level of charge 66 therein to level 77. The transfer of charge into well 72 is equivalent to causing a current I to flow through lead 56; this charge must come from the operational amplifier output 14a-3, through capacitor 14b, if reset switch 14c is open. Thus, a flow of charge from the relatively shallow row well 76 to the column well 72 causes the amplitude of the voltage across capacitor 60 (if switch 14d is closed), to increase during the "read" time $T_a$. During a storage time $T_b$ (comprising the remainder of a row cycle time $\Delta t$), the row electrode 48 is held at a greater potential (e.g. due to the more negative voltage $-V_3$) than the column electrode potential. The row storage voltage $-V_3$ may have a value of $-16$ volts in the illustrative example. As the potential well 74 is now deeper than the column potential well level, the carrier holes 66 will now flow, as illustrated by arrow 78a, to the deeper (more negative) well 74 until charges 70 have all been re-stored in the row potential well, raising the charge level thereof to a level 78. When the row well potential is again raised to $-V_1$ volts, the bottom of this well is again raised to level 76, providing potential energy to the carriers for a next read cycle transition, along arrow 76a, into the column potential well 72. Since each of carriers 66/68/70 is provided responsive to the photon impinging upon the epitaxial layer 34, each additional carrier now present for transfer during the next read time interval causes the charge amplifier means output voltage $V_0'$ to increase, if the reset switch 14c is open and the output-connect switch 14d is closed.

Drain region 38 has a very deep potential well 80 provided therein by connection of a relatively large magnitude voltage $-V_5$, e.g. about $-18$ volts DC in the illustrative embodiment. Typically, the drain potential is operative as long as the sensor is in use. The column and row potential wells 72 and 74 are separated from drain potential well 80 by a region in which a gate potential well 85 is provided responsive to the potential on gate electrode 44. During the normal store/read charge movement cycle in potential wells 72 and 74, gate electrode 44 receives a substantially zero magnitude potential, such that the gate potential well thereunder is at a level 86 substantially equal to the potential, e.g. zero volts, placed upon epitaxial layer 34. Responsive to this substantially zero magnitude potential, the substantially-zero depth of potential well 85 forms a barrier between wells 72/74 and drain well 80, such that carriers 66, 68 or 70 cannot be drawn into well 80. After a number, typically predetermined, of store/read cycles, the stored charges are moved and drained by providing a potential of magnitude $-V_4$, greater than the greatest magnitude row potential ($-V_3$) but less than the drain potential ($-V_5$), to reduced the bottom level 87 of gate well 85 to a level less than the bottom level of column well 72 and greater than drain well 80. Thus, when the level in row well 74 is raised to the "upper" level 76, most of electrons 68 travel, as shown by arrow 76a, into column well 72, are then drawn, as shown by arrow 87a, into the somewhat deeper gate well 85, and then are typically drawn, as shown by arrow 80a, into drain region 80 and then conducted out drain lead 40. A number of row well cycles, between upper and lower levels 76 and 78 can be used to conduct substantially all of the photon-responsive charges out of the substrate. The drain time interval ends when the voltage on gate electrode 44 again rises to substantially zero volts (at time $t_1$) and the potential 85 returns to the substantially zero depth level 86, removing the opportunity for charges 66 to travel from well 72 to drain 80. The depth of well 85 can be so arranged as to leave some small portion of the carriers in well 72 to provide a net positive charge therein at the cessation of the drain time interval (between time $t_0$ and time $t_1$) which small net positive charge is preselected to keep interface states charged and substantially zero-out deleterious charge phenomena (dark current and the like) expected during the store/readout cycles until the next drain interval occurs.

The complete time sequence for apparatus 10 thus has a cycle commencing at time $t_0$, when the gate G signal falls from its normally-low value (e.g. about zero volts) to a relatively high potential amplitude (the $-V_4$ condition, e.g. about $-17$ volts) to commence the charge removal, or drain, state. In the drain state time interval from time $t_0$ through time $t_1$, e.g. about 12 milliseconds in one embodiment, a relatively large number of the periodic storage/read cycles (having a typical time interval $\Delta t$ of about 100 microseconds) of the row signal occur. During each read time interval $t_a$, an opportunity is furnished for charge 68 to flow out of row well 76, through column well 72 and gate well 85, into drain 80 and are thence removed from the sensor. As best seen in FIG. 3a the number of charge carriers abruptly decreases, as shown by the abrupt rising portion 90a of the output voltage $V_0'$ curve, at the beginning time $t_0$ of the drain interval. Substantially all of the carriers have drained from wells 72 and 74 at the end of drain portion 92a, at time $t_1$. Only the pre-bias charges are now left. At this time, the gate potential returns to the first gate potential level (e.g. about zero volts) and any carriers trapped in well 85 divide between column well 72 and the drain, as the gate well level returns to the substantially zero level 86; the charge amplifier output voltage $V_0'$ therefore responds with an increasing amplitude portion e.g. negative-going portion 94a. The actual measurement time interval $T_M$ commences at time $t_1$ and lasts until the time $t_0'$, at which time the next resetting drain interval commences with rising portion 90b. During the measurement time interval, i.e. between the rising edge of a first gate signal pulse and the falling edge of the next gate pulse, a multiplicity of store/read charge transfer time intervals $\Delta t$ occur. Typically, the measurement time interval $T_M$ is one second, where $10E+4$ cycles of the $10E-4$ second duration store/read cycle of the row signal waveform occur therein. The charge amplifer output voltage $V_0'$ amplitude will change by an amount $\Delta V$ which is equal to an integer number n, where n equals 0, 1, 2, 3, . . . , times the voltage increment provided by a single photon-generated carrier (e.g., a hole) being intercepted by the single pixel of the sensor and converted into a charge stored and subsequently readout from wells 72 and 74. In the measurement interval $T_M$ in the left-hand portion of FIG. 3a, the staircase-like charge amplifier output signal waveform portion 96a illustrates the effect of a relatively large incident photon flux, wherein the output signal change $\Delta V$ occurs in each of the multiplicity of read-store cycle time intervals $\Delta T$, such that the portion 96a hits a maximum amplitude saturation portion 98a, at an output voltage of $-V_{SAT}$ at a time $t_s$ prior to the end of the measurement interval. The saturation of the system, responsive to the relatively high incident flux, continues until the time $t_0'$ at which the next resetting-drain/cycle occurs. As seen in the second cycle, the measurement time interval $T_M'$ beginning at time $t_1'$ at the end of charge removal portion 92b, includes a staircase portion 96b in which reception of a lesser photon flux occurs, so that it is only a plurality of the read/store cycles, e.g. in a time interval $k\Delta t$ (where k is an integer much greater than 1, for the illustrated situation) that the minimum staircase portion voltage change $\Delta V$ occurs. The slower change in output voltage $V_0'$ allows a non-saturation minimum voltage, at a point 97, to be reached at the commencement time $t_0''$ of a next-subsequent operation cycle. With the accumulator zeroing Z signal and display blanking B signal occurring during the drain portion pulse, from time $t_0$ to $t_1$, and the train of sequencer outputs 21f–21h pulses (including the sampling S pulse, followed by the conversion C' pulse and the accumulation A pulse) all occurring in sequence in selected ones of the storage time intervals $T_b$, the total number of photons irradiating the sensor in the measurement period $T_M$, $T_M'$, . . . , is thus displayed at the end of each measurement interval.

Our novel high-sensitivity charge-injection-device photometer/radiometer has been described with respect to one presently preferred embodiment. Many modifications and variations will now become apparent to those skilled in the art. For example, the N-type epitaxial layer of the illustrated embodiment can be modified to N-type bulk semiconductor material; reversal of impurity types, e.g. P+ to N+ and N to P, can be equally as well utilized with either structure. It is our intent, therefore, to be limited only by the scope of the appending claims, and not by way the specific details and instrumentalities presented by way of explanation of the one presently preferred design, described herein.

What we claim is:

1. Apparatus for sensing at least the amplitude of incident optical radiation, comprising:
   a charge-injection device (CID) sensor having a single pixel, including (1) a drain potential well delimiting a photon-responsive area from which charge carriers, formed responsive to impingent photons of said optical radiation, can be collected, (2) a column potential well in which said carriers are collected, (3) a row potential well, and (4) a gate electrode positioned between said drain well and said column and row wells for respectively connecting and disconnecting said drain well and said column potential well responsive to respective first and second states of a gate signal to respectively allow and prevent removal of said charge carriers to said drain well from at least said column well;

means for reducing the operating temperature of said CID sensor;

sequencer means for first permanently removing charge carriers from said column and row potential wells at least via said drain well, in a charge removal time interval at the commencement of each of at least one optical radiation sensing time interval, and for then causing, for a predetermined number, on the order of 10,000, of cycles in each sensing time interval, charge carriers present in said column and row wells during each of said cycles to repeatedly and non-destructively move between said column and row wells in a predetermined manner; and means for converting a charge current, resulting from each of said charge carrier movement cycles, to a human-viewable display of the amplitude of said optical radiation incident upon said sensor, with a sensitivity of at least 10E-14 Watts/cm$^2$, and comprising:

(a) charge amplifier means for converting the charge current to the amplitude of a signal representative of the total charge then in said sensor pixel;

(b) correlated double sampling means for providing an output signal in which is cancelled from the amplitude thereof contributions by portions of the total charge in said pixel not responsive to photons of said incident optical radiation; and (c) means for accumulating the amplitude of the correlated double sampling means output signal to provide, responsive to the completion of said predetermined number of charge movement cycles, said amplitude display.

2. The apparatus of claim 1, wherein said sequencer means further provides all necessary sequences of signals to said sensor and all portions of said converting means, responsive to an externally-provided command to display the incident radiation value.

3. The apparatus of claim 1, wherein a sufficient number of charge carriers are left within at least one of said row and column potential wells, during each charge removal time interval, to substantially compensate for deleterious charge interface states existant within said sensor.

4. The apparatus of claim 3, wherein said sequencer means further provides all necessary sequences of signals to said sensor and all portions of said converting means, responsive to an externally-provided command to display the incident radiation value.

5. The apparatus of claim 1, wherein said sensor comprises:

a substrate of a first conductivity-type semiconductor material, said substrate having a first surface;

an epitaxial layer of a second conductivity-type, opposite in polarity to said first conductivity-type, of said semiconductor material, and having a surface opposite said substrate surface;

a drain region formed adjacent to said epitaxial layer surface;

first means for insulatively enclosing at least a portion of said layer surface and said drain region;

means, juxtaposed with said epitaxial layer, with respect to said first enclosing means, for defining row and column electrodes so positioned as to be insulated from one another and to form connectable potential wells beneath said column and row electrodes, and for defining a gate electrode so positioned as to be insulated from the other electrodes and to cause a gate potential well to be temporarily establishable between at least a portion of the total column and row potential wells and a potential well formed adjacent to said drain region.

6. The apparatus of claim 5, further comprising second means for insulatively enclosing said column electrodes and said row electrodes.

7. The apparatus of claim 6, wherein said row and gate electrodes are fabricated substantailly co-planar with one another, in a plane spaced from another plane in which said column electrode is fabricated.

8. The apparatus of claim 7, further comprising third insulative means, acting in conjunction with said first and second insulating means, for completely enclosing said column electrode.

9. The apparatus of claim 5, wherein said gate electrode has at least one narrow and elongated finger portion.

10. The apparatus of claim 9, wherein said row electrode has a plurality of narrow elongated finger portions, with each different pair of row electrode finger portions being substantially parallel to, and insulated from, a different one of said at least one gate electrode finger portion, and with all of said row electrode finger portions being in electrical connection with one another.

11. The apparatus of claim 10, wherein the spacing distance between each adjacent pair of row electrode finger portions does not exceed the charge carrier diffusion length in said semiconductor material.

12. The apparatus of claim 10, wherein said collector electrode comprises a plurality of narrow finger portions elongated in a direction substantially transverse to the direction of elongation of the plurality of row electrode finger portions, each of said column electrode finger portions having a first end aligned with all other first ends and a second end aligned with all other second ends, and first and second common portions respectively connecting all of said first ends and all of said second ends.

13. The apparatus of claim 12, wherein the spacing distance between each adjacent pair of column electrode finger portions does not exceed the charge carrier diffusion length in said semiconductor material.

14. The apparatus of claim 5, wherein said epitaxial layer is maintained at a substantially zero potential; said row electrode is switched between a first magnitude of potential, with respect to a second potential magnitude substantially permanently provided to said column electrode, and a third potential of magnitude greater than the column electrode potential, to respectively move charge carriers into, and out of, said column potential well.

15. The apparatus of claim 14, wherein said sequencer means operates to switch the potential at said gate electrode between a value substantially equal to the potential at the epitaxial layer and a fourth potential value, greater than said third value, and only present at said gate electrode when substantial flow of charges is required from said column and row potential wells and into said drain region for removal from the sensor.

16. The apparatus of claim 1, wherein said sensor comprises:
- a substrate of a first conductivity-type bulk semiconductor material, said substrate having a first surface;
- a drain region formed adjacent to said first surface;
- first means for insulatively enclosing at least a portion of said first surface and said drain region;
- means, juxtaposed with said first surface, with respect to said first enclosing means, for defining row and column electrodes so positioned as to be insulated from one another and to form connectable potential wells beneath said column and row electrodes, and for defining a gate electrode so positioned as to be insulated from the other electrodes and to cause a gate potential well to be temporarily establishable between at least a portion of the total column and row potential wells and a potential well formed adjacent to said drain region.

17. The apparatus of claim 16, further comprising second means for insulatively enclosing said column electrodes and said row electrodes.

18. The apparatus of claim 17, wherein said row and gate electrodes are fabricated substantially co-planar with one another, in a plane spaced from another plane in which said column electrode is fabricated.

19. The apparatus of claim 18, further comprising third insulative means, acting in conjunction with said first and second insulating means, for completely enclosing said column electrode.

20. The apparatus of claim 16, wherein said gate electrode has at least one narrow and elongated finger portion.

21. The apparatus of claim 20, wherein said row electrode has a plurality of narrow elongated finger portions, with each different pair of row electrode finger portions being substantially parallel to, and insulated from, a different one of said at least one gate electrode finger portion, and with all of said row electrode finger portions being in electrical connection with one another.

22. The apparatus of claim 21, wherein the spacing distance between each adjacent pair of row electrode finger portions does not exceed the charge carrier diffusion length in said semiconductor material.

23. The apparatus of claim 21, wherein said collector electrode comprises a plurality of narrow finger portions elongated in a direction substantially transverse to the direction of elongation of the plurality of row electrode finger portions, each of said column electrode finger portions having a first end aligned with all other first ends and a second end aligned with all other second ends, and first and second common portions respectively connecting all of said first ends and all of said second ends.

24. The apparatus of claim 23, wherein the spacing distance between each adjacent pair of column electrode finger portions does not exceed the charge carrier diffusion length in said bulk semiconductor material.

25. The apparatus of claim 16, wherein said row electrode is switched between a first magnitude of potential, with respect to a second potential magnitude substantially permanently provided to said columm electrode, and a third potential of magnitude greater than the column electrode potential, to respectively move charge carriers into, and out of, said column potential well.

26. The apparatus of claim 25, wherein said sequencer means operates to switch the potential at said gate electrode between a value substantially equal to the potential of the bulk material and a fourth potential value, greater than said third value, and only present at said gate electrode when substantial flow of charges is required from said column and row potential wells and into said drain region for removal from the sensor.

* * * * *